United States Patent
Tran

[11] Patent Number: 6,034,420
[45] Date of Patent: Mar. 7, 2000

[54] ELECTROMIGRATION RESISTANT PATTERNED METAL LAYER GAP FILLED WITH HSQ

[75] Inventor: Khanh Tran, San Jose, Calif.

[73] Assignee: Advanced Micro Devices, Inc., Sunnyvale, Calif.

[21] Appl. No.: 08/993,051

[22] Filed: Dec. 18, 1997

[51] Int. Cl.[7] .................................................. H01L 23/58
[52] U.S. Cl. ......................... 257/644; 257/650; 257/751; 257/763; 257/765; 257/770; 257/771
[58] Field of Search ................................... 257/644, 650, 257/676, 751, 763, 765, 770, 771

[56] References Cited

U.S. PATENT DOCUMENTS

| | | | |
|---|---|---|---|
| 5,101,259 | 3/1992 | Watanabe et al. | 257/644 |
| 5,589,712 | 12/1996 | Kawashima et al. | 257/763 |
| 5,670,823 | 9/1997 | Kruger et al. | 257/767 |
| 5,675,186 | 10/1997 | Shen et al. | 257/751 |
| 5,708,303 | 1/1998 | Jeng | 257/751 |
| 5,780,908 | 7/1998 | Sekiguchi et al. | 257/751 |
| 5,786,625 | 7/1998 | Yamaha | 257/767 |
| 5,847,459 | 12/1998 | Taniguchi | 257/763 |

OTHER PUBLICATIONS

Liu et al., "Integrated HDP Technology for Sub–0.25 Micron Gap Fill," Jun. 10–12, 1997, VMIC Conference, 1997, ISMIC–107/97/0618(c), pp. 618–619.

Bothra et al., "Integration of 0.25μm Three and Five Level Interconnect System for High Performance ASIC," Jun. 10–12, 1997, VMIC Conference, 1997, ISMIC–107/97/0043, pp. 43–48.

Wang et al., "Process Window Characterization of Ultima HDP–CVD™ USG Film," Feb. 10–11, 1997, DUMIC Conference 1997 ISMIC–222D/97/0405, pp. 405–408, 619.

Saikawa et al., "High Density Plasma CVD for 0.3μm Device Application," Jun. 18–20, 1996, VMIC Conference 1996 ISMIC–106/96/0069(c), pp. 69–75.

Nguyen et al., "Characterization of High Density Plasma Deposited Silicon Oxide Dielectric for 0.25 Micron ULSI," Jun. 27–29, 1995, VMIC Conference 1995 ISMIC–104/95/0069, pp. 69–74.

*Primary Examiner*—Deborah Jones
*Assistant Examiner*—Cathy F. Lam

[57] ABSTRACT

Spacings between metal features are gap filled with HSQ without degradation of the electromigration resistance by depositing a conformal dielectric liner encapsulating the metal features before depositing the HSQ gap fill layer. Embodiments include depositing a conformal layer of a high density plasma oxide by high density plasma chemical deposition to a thickness of about 100 Å to about 1,000 Å.

7 Claims, 2 Drawing Sheets

ELECTROMIGRATION RESISTANT PATTERNED METAL LAYER GAP FILLED WITH HSQ

TECHNICAL FIELD

The present invention relates to a method of manufacturing a multi-metal layer semiconductor device exhibiting improved electromigration resistance. The invention has particular applicability in manufacturing high density multi-metal layer semiconductor devices with design features of 0.25 microns and under.

BACKGROUND ART

The escalating demands for high densification and performance associated with ultra large scale integration semiconductor devices require design features of 0.25 microns and under, such as 0.18 microns, increased transistor and circuit speeds, high reliability and increased manufacturing throughput. The reduction of design features to 0.25 microns and under challenges the limitations of conventional interconnection technology, including conventional photolithographic, etching and deposition techniques.

Conventional methodology for forming patterned metal layers comprises a subtractive etching or etch back step as the primary metal patterning technique. Such a method involves the formation of a first dielectric layer on a semiconductor substrate, typically monocrystalline silicon, with conductive contacts formed therein for electrical connection with an active region on the semiconductor substrate, such as a source/drain region. A metal layer, such as aluminum or an aluminum alloy, is deposited on the first dielectric layer, and a photoresist mask is formed on the metal layer having a pattern corresponding to a desired conductive pattern. The metal layer is then etched through the photoresist mask to form the conductive pattern comprising metal features separated by gaps, such as a plurality of metal lines with interwiring spacings therebetween. A dielectric layer is then applied to the resulting conductive pattern to fill in the gaps and the surface is planarized, as by conventional etching or chemical-mechanical polishing (CMP) planarization techniques.

As shown in FIGS. 1 and 2, conventional practices comprise depositing metal layer 11 on dielectric layer 10 which is typically formed on a semiconductor substrate containing an active region with transistors (not shown) After photolithography, etching is then conducted to form a patterned metal layer comprising metal features 11a, 11b, 11c and 11d with gaps therebetween. A dielectric material 12, such as spin on glass (SOG), is typically deposited to fill in the gaps between the metal features, and baked at a temperature of about 300° C. to about 450° C., for a period of time up to about two hours, depending upon the particular SOG material employed, to enhance the dielectric properties of SOG. A layer of silicon dioxide is deposited by plasma enhanced chemical vapor deposition (PECVD) to cap the SOG layer and is subsequently planarized, as by CMP, before the next level of via and metal wiring is attempted.

As feature sizes, e.g., metal lines and interwiring spacings, shrink to 0.25 microns and below, such as 0.18 microns, it becomes increasingly difficult to satisfactorily fill in the interwiring spacings voidlessly and obtain adequate step coverage. Hydrogen silsesquioxane (HSQ) offers many advantages for use in interconnect patterns. HSQ is relatively carbon free, thereby avoiding poison via problems. Moreover, the absence of carbon renders it unnecessary to etch back HSQ below the upper surface of the metal lines to avoid shorting. In addition, HSQ exhibits excellent planarity and is capable of gap filling interwiring spacings less than 0.15 microns employing conventional spin-on equipment. HSQ undergoes a melting phase at approximately 200° C., but does not convert to the high dielectric constant glass phase until reaching temperatures of about 400° C. for intermetal applications and about 700° C. to about 800° C. for premetal applications.

However, after experimental investigation and testing, it was found that the use of HSQ to gap fill the spaces between metal features results in a degradation of the electromigration resistance of the metal feature, e.g., a metal line. Electromigration failure is a serious limitation on the lifetime and reliability of conventional semiconductor devices and is attributed to the conductive interconnection lines. The phenomenon of electromigration involves the flow of electrons causing the migration of atoms, thereby generating voids and hillocks. The formation of voids creates an opening in a conductive interconnection line, thereby decreasing the performance of the interconnection line. The formation of voids generates areas of increased resistance which undesirably reduce the speed of a semiconductor device. Thus, the electromigration phenomenon constitutes a limitation on the lifetime of the conductive interconnection line, as well as the performance of the semiconductor device.

Electromigration in a metal interconnection line can be characterized by the movement of ions induced by a high electrical current density. As miniaturization of the feature size of the semiconductor device increases, the current density also increases and, hence, electromigration induced metallization failures increase. Current metallization failures resulting from electromigration exceed about 30% of the total of metallization failures.

The continuing demand for increased miniaturization requires conductive patterns comprising features, such as conductive lines with interwiring spacings therebetween, having a feature size of about 0.25 microns and under. Semiconductor devices comprising conductive patterns having sub-micron design features are characterized by a high electrical current density and, consequently, increased metallization and electromigration failures. The requirement for a longer electromigration lifetime is of critical importance for an interconnection system.

Prior attempts to restrain electromigration involve the use of overcoating, alloying, or multilevel metallization. In copending application Ser. No. 08/992,953, filed on on Dec. 18, 1997, the electromigration characteristics of metal features are improved by applying a conductive layer to substantially surround and encapsulate the metal features, as by depositing a conductive composite comprising a first layer of titanium and a second layer of titanium-nitride.

There exists a need for semiconductor technology enabling the use of HSQ as a gap fill layer without adversely affecting the electromigration resistance of metal features, such as metal lines. There exists a particular need for semiconductor technology enabling the use of HSQ as a gap fill layer for metal features of about 0.25 microns and under without adversely affecting electromigration resistance.

DISCLOSURE OF THE INVENTION

An object of the present invention is a highly integrated semiconductor device containing an interconnection structure comprising metal features gap filled with HSQ, which interconnection structure exhibits an enhanced electromigration lifetime.

Another object of the present invention is a method of manufacturing a semiconductor device employing HSQ as a gap fill layer without adverse affecting the electromigration existence of the gap filled metal features.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a semiconductor device comprising: a dielectric layer; a first patterned metal layer formed on the dielectric layer, the patterned metal layer having metal features with an upper surface and side surfaces and gaps between the metal features; a substantially conformal dielectric layer on the upper surface and side surfaces of the metal features and lining the gaps; and a layer of hydrogen silsesquioxane (HSQ) on the substantially conformal dielectric layer and filling the gaps.

Another aspect of the present invention is a method of manufacturing a semiconductor device, which method comprises: forming a dielectric layer on a substrate; forming a patterned metal layer on the dielectric layer, the patterned metal layer containing metal features having an upper surface and side surfaces and gaps between the metal features; forming a substantially conformal dielectric layer on the upper surface and side surfaces of the metal features and lining the gaps; and forming a layer of hydrogen silsesquioxane (HSQ) on the substantially conformal dielectric layer and filling the gaps.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
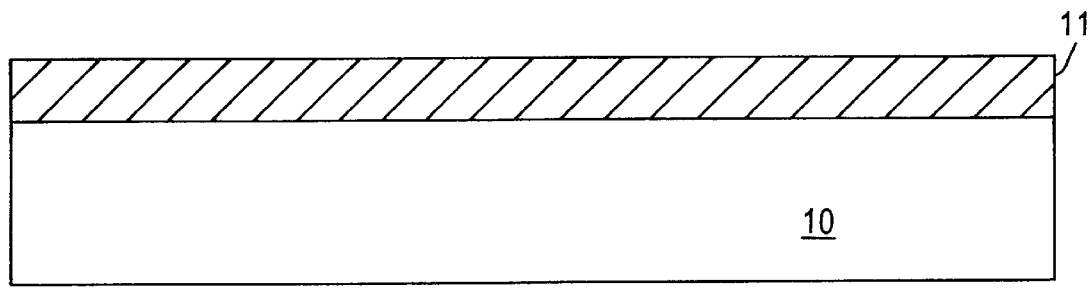
FIGS. 1 and 2 schematically illustrate conventional methodology in gap filling a patterned metal layer.
Figure 2:
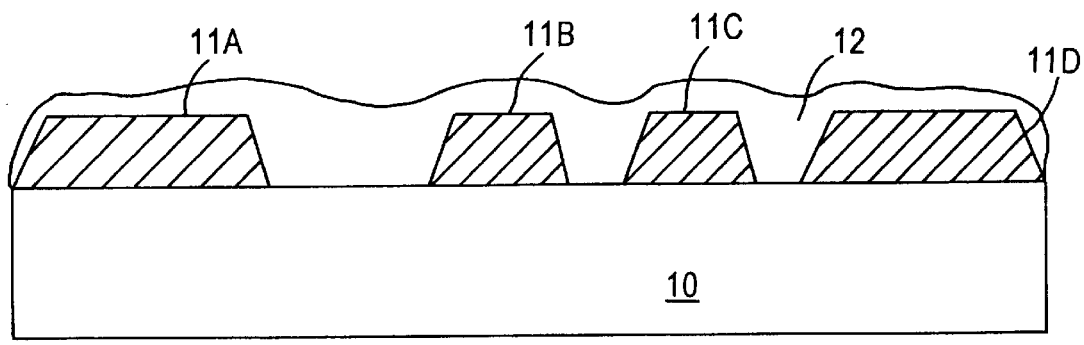

The present invention enables the use of HSQ to gap fill, particularly a patterned metal layer comprising metal features, such as metal lines, having a feature size of about 0.25 microns and under, without adverse reduction of the electromigration resistance of the metal features. A limitation on the lifetime and reliability of conventional semiconductor devices attributed to metal interconnections is due to electromigration. The phenomenon of electromigration involves the flow of electrons causing the migration of metal atoms, thereby generating voids and hillocks. The formation of voids creates an opening in a metal layer or line, thereby decreasing performance. The formation of voids generates areas of increased resistance which undesirably reduce the speed at which a semiconductor device can function. Thus, the electromigration phenomenon constitutes a limitation on the lifetime of a metal line as well as the performance of the semiconductor device. In the extreme case, the device becomes non-functional due to a discontinuity in the metal line generated by a sufficiently large void.

Electromigration in a metal interconnection line can be characterized by the movement of ions induced by a high electrical current density. As the feature size of semiconductor devices decreases, the current density consequently increases and, hence, electromigration-induced metallization failures increase. Current metallization failures resulting from electromigration are acutely problematic.

Semiconductor devices comprising conductive patterns having design features of 0.25 microns and under are characterized by a high electrical current density and, consequently, increased metallization electromigration failures. The requirement for a long electromigration lifetime is of critical importance for an interconnection system. The increased susceptibility to electromigration as design features shrink is exacerbated by a reduction in electromigration resistance upon attempting to employ HSQ to gap fill patterned metal layers.

The exact mechanism involved in degradation of the electromigration resistance of metal features, such as metal lines, gap filled with HSQ is not known. However, it is believed that the relative low density or softness of the deposited HSQ gap fill layer renders it undesirably flexible and, hence, susceptible to aluminum extrusion during electromigration. In accordance with the present invention, a thin, substantially conformal dielectric layer is deposited on a patterned metal layer to encapsulate the metal features lining the gaps therebetween. Desirably, the substantially conformal dielectric layer comprises a material having a higher density than that of HSQ. HSQ is then deposited on the substantially conformal dielectric layer gap filling the spaces between the metal features which spaces are lined with a thin layer of the denser conformal dielectric material.

The exact mechanism involved in preventing the degradation of the metal features contain a conformal dielectric lining in accordance with the present invention prior to gap filling with HSQ is not known with certainty. However, electromigration occurs primarily along metal grain boundaries wherein the activation energy is the least. It is, therefore, believed that initially encapsulating the patterned metal features with a relatively dense dielectric material serves to freeze the grain boundaries, thereby preventing grain boundary movement and growth, which significantly improves the electromigration characteristics of the patterned metal features.

In the various embodiments of the present invention, the substantially conformal dielectric layer can comprise any of various dielectric materials which exhibits a density sufficiently greater than HSQ to prevent a reduction in electromigration resistance of metal features, such as an oxide, a nitride, oxynitride or silicon oxime. In preferred embodiments of the present invention, a substantially conformal oxide layer is deposited to encapsulate the patterned metal features, since oxides generally exhibit a lower dielectric constant than nitrides or oxynitrides. By employing an oxide having a relatively low dielectric constant, capacitive coupling between conductive lines is reduced, thereby enhancing circuit speed.

In a preferred embodiment of the present invention, a high density plasma (HDP) oxide is deposited as the conformal dielectric liner prior to deposition of HSQ as a gap filling layer. HDP oxide is typically deposited by high density plasma chemical vapor deposition (HDP-CVD). See, for example, Liu et al., "Integrated HDP Technology for Sub-0.25 Micron Gap Fill", pp. 618–619; Bothra et al., "INTEGRATION OF 0.25 µm THREE AND FIVE LEVEL INTERCONNECT SYSTEM FOR HIGH PERFORMANCE ASIC.", pp. 43–48; Wang et al., "Process Window Characterization of ULTIMA HDP-CVD$^{FM}$ USG Film", pp. 405–408; Saikawa et al., "High Density Plasma CVD for 0.3 µm Device Application", pp. 69–75; Nguyen et al., "CHARACTERIZATION OF HIGH DENSITY PLASMA DEPOSITED SILICON OXIDE DIELECTRIC FOR 0.25 MICRON ULSI", pp. 69–74; all of which papers were presented at the Jun. 10–12, 1997 VMIC Conference, 1997 ISMIC.

HDP oxide easily fills gaps in a patterned metal layer with a 0.25 micron design rule. HDP oxide is relatively dense and exhibits high chemical stability and etch resistance. Advantageously, HDP oxide can be deposited as a thin conformal layer, having a thickness of about 100 Å to about 1,000 Å, encapsulating metal features having a feature size of about 0.25 microns which are typically formed with an interwiring spacing of about 0.375 microns.

Figure 3:
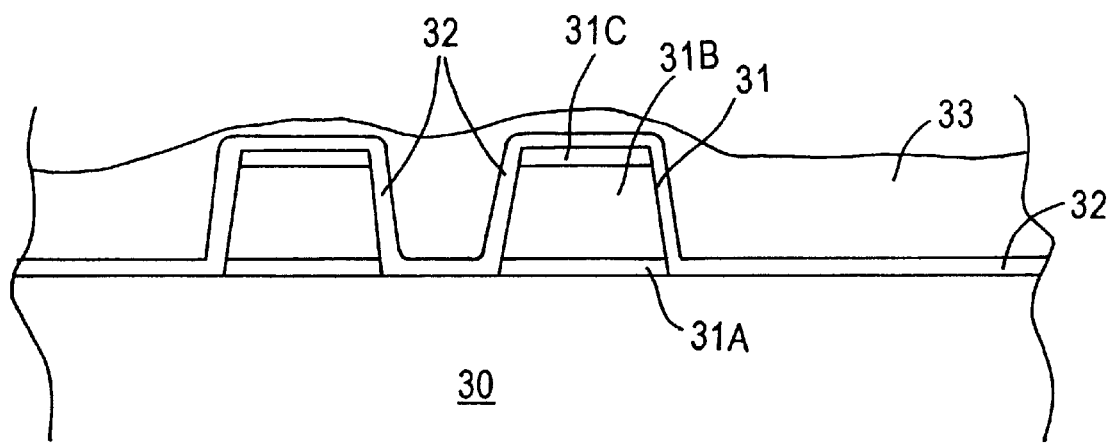
FIG. 3 schematically illustrates an embodiment of the present invention.

An embodiment of the present invention is schematically illustrated in FIG. 3 and comprises metal features 31 formed on dielectric layer 30. Metal features 31 can be formed consistent with conventional practices and typically comprise a first lower metal layer 31A of a refractory metal, such as tungsten or titanium, an intermediate primary conductive layer 31B, such as aluminum or an aluminum alloy, and an upper anti-reflective coating 31C, such as titanium nitride. A relatively high density substantially conformal dielectric layer 32 is then deposited encapsulating metal features 31 and lining the gaps therebetween. In a preferred embodiment, conformal dielectric layer 32 comprises high density plasma oxide deposited by HDP chemical vapor deposition. After depositing the conformal dielectric liner 32, HSQ gap fill layer 33 is deposited on conformal dielectric layer 32, filling the gaps and covering the encapsulated metal features.

The present invention enables the use of HSQ as a gap fill layer without adversely affecting the electromigration resistance of the patterned metal features by depositing a relatively dense substantially conformal dielectric liner encapsulating the metal features prior to HDP deposition. The present invention is applicable to the production of various types of semiconductive devices, particularly high density multi-metal patterned layers with submicron features, particularly submicron features of 0.25 microns and below, exhibiting high speed characteristics and improved reliability. The present invention enables the advantageous use of HSQ to gap fill patterned metal layers without an attendant decrease in electromigration resistance. The present invention is cost effective and can easily be integrated into conventional processing and equipment.

In carrying out the embodiments of the present invention, the metal layers can be formed of any metal typically employed in manufacturing semiconductor devices, such as aluminum, aluminum alloys, copper, copper alloys, gold, gold alloys, silver, silver alloys, refractory metals, refractory metal alloys, and refractory metal compounds. The metal layers of the present invention can be formed by any technique conventionally employed in the manufacture of semiconductor devices. For example, the metal layers can be formed by conventional metallization techniques, such as various types of CVD and sputtering processes, including low pressure chemical vapor deposition (LPCVD), collimated physical vapor deposition (COLPVD), and ionized-metal physical vapor deposition (IMPVD). Normally, when high melting metal point metals such as tungsten are deposited, CVD techniques are employed. Low melting point metals, such as aluminum and aluminum-base alloys, including aluminum-copper alloys, can also be deposited by melting, sputtering, or physical vapor deposition (PVD).

In the previous descriptions, numerous specific details are set forth, such as specific materials, structures, chemicals, processes, etc., in order to provide a thorough understanding of the present invention. However, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A semiconductor device comprises:

a dielectric layer;

a first patterned metal layer formed on the dielectric layer, the patterned metal layer having metal features with an upper surface and side surfaces and gaps between the metal features;

a substantially conformal dielectric layer on the upper surface and side surfaces of the metal features and lining the gaps; and a layer of hydrogen silsesquioxane (HSQ) on the substantially conformal dielectric layer and filling the gaps, wherein the conformal dielectric layer comprises a material having a density greater than that of HSQ.

2. The semiconductor device according to claim 1, wherein the substantially conformal dielectric layer comprises an oxide liner.

3. The semiconductor device according to claim 2, wherein the oxide liner has a thickness of about 100 Å to about 1,000 Å.

4. The semiconductor device according to claim 3, wherein the substantially conformal oxide layer comprises a high density plasma silicon oxide.

5. The semiconductor device according to claim 1, wherein the metal layer is a composite comprising:

a lower refractory layer;

an intermediate primary conductive layer containing aluminum or an aluminum alloy; and an upper anti-reflective coating.

6. The semiconductor device according to claim 1, wherein the metal features comprise metal lines having a width no greater than about 0.25 microns and the gaps comprise interwiring spacings no greater than about 0.375 microns.

7. A semiconductor device according to claim 1, wherein the conformal dielectric layer comprises a material selected from the group consisting of oxides, nitrides, oxynitrides and silicon oxime.

* * * * *